United States Patent
Savariar-Hauck et al.

(10) Patent No.: US 9,417,524 B1
(45) Date of Patent: *Aug. 16, 2016

(54) INFRARED RADIATION-SENSITIVE LITHOGRAPHIC PRINTING PLATE PRECURSORS

(71) Applicant: Eastman Kodak Company, Rochester, NY (US)

(72) Inventors: Celin Savariar-Hauck, Badenhausen (DE); Monika Bruemmer, Sonnenstein (DE); Martin Heinrich, Windhausen (DE)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/642,863

(22) Filed: Mar. 10, 2015

(51) Int. Cl.
*G03F 7/00* (2006.01)
*G03F 7/038* (2006.01)
*G03F 7/20* (2006.01)

(52) U.S. Cl.
CPC . *G03F 7/038* (2013.01); *G03F 7/20* (2013.01)

(58) Field of Classification Search
None
See application file for complete search history.

(56) References Cited

U.S. PATENT DOCUMENTS

| | | | |
|---|---|---|---|
| 5,811,220 A | 9/1998 | Cheng et al. | |
| 6,190,830 B1 | 2/2001 | Leon et al. | |
| 6,423,469 B1 | 7/2002 | DoMinh et al. | |
| 6,447,978 B1 | 9/2002 | Leon et al. | |
| 6,503,684 B1 | 1/2003 | Vermeersch et al. | |
| 6,582,882 B2 | 6/2003 | Pappas et al. | |
| 6,680,161 B2 | 1/2004 | Oohashi | |
| 6,899,994 B2 | 5/2005 | Huang et al. | |
| 7,005,234 B2 | 2/2006 | Hoshi et al. | |
| 7,368,215 B2 | 5/2008 | Munnelly et al. | |
| 7,767,382 B2 | 8/2010 | Van Damme et al. | |
| 8,043,787 B2 | 10/2011 | Hauck et al. | |
| 8,679,726 B2 | 3/2014 | Balbinot et al. | |
| 2005/0003285 A1 | 1/2005 | Hayashi et al. | |
| 2010/0009130 A1* | 1/2010 | Yu | B41C 1/1016 428/195.1 |
| 2010/0129616 A1* | 5/2010 | Collins | B41C 1/1025 428/195.1 |
| 2013/0101938 A1* | 4/2013 | Hayashi | G03F 7/029 430/283.1 |

FOREIGN PATENT DOCUMENTS

| | | |
|---|---|---|
| EP | 1 674 928 | 6/2006 |
| EP | 1 790 492 | 5/2007 |

* cited by examiner

*Primary Examiner* — Chanceity Robinson
(74) *Attorney, Agent, or Firm* — J. Lanny Tucker

(57) ABSTRACT

A negative-working, infrared radiation-sensitive lithographic printing plate precursor is prepared to contain an infrared radiation-sensitive imageable layer that is disposed on the hydrophilic surface of a substrate. This imageable layer contains sufficient free radical chemistry for infrared sensitivity and imaging to polymerize the exposed regions. This chemistry is dispersed within a primary polymeric binder comprising polyalkylenes oxide segments and optional pendant cyano groups and is present in the form of particles, and a secondary crosslinked hydrophobic binder to provide improved ink receptivity, rapid development, and run length especially with aged precursors. Exposed precursors can be developed on-press while forming the first printed impressions.

16 Claims, No Drawings

INFRARED RADIATION-SENSITIVE LITHOGRAPHIC PRINTING PLATE PRECURSORS

RELATED APPLICATION

Reference is made to U.S. Ser. No. 14/642,876 filed on Mar. 10, 2015, by Kamiya, Hoyashi, Sekiguchi, and Hayakawa and entitled "Negative-working Lithographic Printing Plate Precursor and Use."

FIELD OF THE INVENTION

This invention relates to negative-working, infrared radiation-sensitive lithographic printing plate precursors that can be imaged and readily processed to provide improved lithographic printing plates with excellent ink receptivity.

BACKGROUND OF THE INVENTION

In lithographic printing, lithographic ink receptive regions, known as image areas, are generated on a hydrophilic surface. When the hydrophilic surface is moistened with water and lithographic ink is applied, the hydrophilic regions retain the water and repel the lithographic ink and the lithographic ink receptive regions accept the lithographic ink and repel the water. The lithographic ink is then transferred to the surface of suitable materials upon which the image is to be reproduced. In some instances, the lithographic ink can be first transferred to an intermediate blanket that in turn is used to transfer the lithographic ink to the surface of the materials upon which the image is to be reproduced.

Lithographic printing plate precursors useful to prepare lithographic (or offset) printing plates typically comprise one or more imageable layers applied over a hydrophilic surface of a substrate (or intermediate layers). The imageable layer(s) can comprise one or more radiation-sensitive components dispersed within a suitable binder. Following imaging, either the exposed regions or the non-exposed regions of the imageable layer(s) are removed by a suitable developer (processing solution), revealing the underlying hydrophilic surface of the substrate. If the exposed regions are removed, the precursor is considered as positive-working. Conversely, if the non-exposed regions are removed, the precursor is considered as negative-working. In each instance, the regions of the imageable layer(s) that remain are lithographic ink-receptive, and the regions of the hydrophilic surface revealed by the developing process accept water or aqueous solutions (typically a fountain solution), and repel lithographic ink.

"Laser direct imaging" methods (LDI) are used to directly form an offset lithographic printing plate or printing circuit board using digital data from a computer. There have been considerable improvements in this field from use of more efficient lasers, improved imageable compositions and components thereof, and improved processing compositions and procedures.

Various radiation-sensitive compositions are used in negative-working lithographic printing plate precursors as described in numerous publications such as U.S. Pat. No. 7,767,382 (Van Damme et al.) that describes a method of forming lithographic printing plates without rinsing after processing (development). Many other publications provide details about such negative-working radiation-sensitive compositions comprising necessary imaging chemistry dispersed within suitable polymeric binders. After imaging, the negative-working lithographic printing plate precursors are developed (processed) to remove the non-imaged (non-exposed) regions of the imageable layer.

Negative-working lithographic printing plate precursors that can be imaged and processed in known ways can contain polymeric binders and oligomers having acidic groups that promote off-press processing in aqueous alkaline developers (processing solutions). On-press developable imaged precursors depend upon properties of the lithographic printing ink/fountain solution emulsion to develop (remove) non-exposed regions during the initial printing impressions. Irrespective of the mode of development, off-press or on-press, the resulting lithographic printing plates should exhibit good ink receptivity in the imaged (exposed) regions of the printing surface and at the same time exhibit sufficient developability in the non-exposed (non-imaged), especially in the shadows of the printing image.

For on-press developable precursors, the use of polymeric binder in the negative-working imageable layer comprising pendant cyano groups and pendant polyalkylenes oxide segments, as described for example in U.S. Patent Application Publication 2005-0003285 (Hayashi et al.), have been found to be especially useful to provide solvent resistance and higher run length. Such polymeric binders can be present in particulate form.

Hydrophilic co-binders can be included in the imageable layer to enhance processing speed. Oligomers having ethylene oxide groups (with crosslinking sites) can provide desired developability on-press through interaction with the fountain solution. However, such hydrophilic co-binders and oligomers, while providing the necessary speed for on-press development can lead to slower ink receptivity of the image areas. In some cases, the ink receptivity may appear sufficient initially but during the course of the printing process, ink repellency can increase, a phenomena called "blinding". The result of this problem is that the printed sheets have a weak image without sufficient ink density and therefore the printing job is a failure.

To enable good ink receptivity and reduced "blinding", negative-working lithographic printing plate precursors can include non-crosslinked hydrophobic binders such as non-crosslinked poly(methyl methacrylate), poly(vinyl acetate), and polystyrene. However, such hydrophobic materials can dissolve in the organic solvents used for coating the imageable layer formulations, and thus forming a film in the imageable layer. Whereas development in non-image (non-exposed) regions can be acceptably fast, slow development in the mid-tone and shadow areas in the printing surface will occur and the screen areas remain clogged throughout a high printing run.

Thus, there are inherent problems from the use of either hydrophilic or hydrophobic co-binders in negative-working lithographic printing plate precursors.

There is a need to further improve the developability in non-exposed regions and ink receptivity in exposed regions in imaged lithographic printing plate precursors that are designed for either on-press or off-press processing.

SUMMARY OF THE INVENTION

The present invention is directed to the problem noted above and provides a negative-working, infrared radiation-sensitive lithographic printing plate precursor comprising:

a substrate having a hydrophilic surface, an infrared radiation-sensitive imageable layer that is disposed on the hydrophilic surface of the substrate, and comprises:

a free radically polymerizable compound;

an initiator composition that provides free radicals upon exposure of the infrared radiation-sensitive imageable layer to infrared radiation;

an infrared radiation absorber;

a primary polymeric binder comprising polyalkylenes oxide segments and optionally pendant cyano groups and is present in the form of particles; and a secondary crosslinked hydrophobic binder that is present in an amount of at least 1 weight % and up to and including 20 weight % based on the total dry weight of the infrared radiation-sensitive imageable layer, and optionally, a hydrophilic overcoat as the outermost layer.

The present invention also provides a method for providing a lithographic printing plate, the method comprising:

imagewise exposing the negative-working, infrared radiation-sensitive lithographic printing plate precursor of any embodiments of the present invention to infrared radiation to provide exposed regions and non-exposed regions in the infrared radiation-sensitive imageable layer, and removing the non-exposed regions in the infrared radiation-sensitive imageable layer from the substrate to provide a lithographic printing plate.

The present invention provides a number of advantages by the incorporation of a secondary crosslinked hydrophobic binder in the infrared radiation-sensitive imageable layer in place of non-crosslinked counterpart materials. The crosslinked hydrophobic binders provide a suitable balance between hydrophobic and hydrophilic properties, thereby providing: (1) an improvement in ink receptivity, (2) a faster development of the mid-tone and shadow areas to provide good resolution in a lithographic printed image in particular from "aged" precursors during on-press development, and (3) higher run length. The present invention enables the user (a lithographic printer) to obtain good quality copies having sufficient ink density and to reduce waste (in copies) while obtaining cleared out screen areas to provide good image resolution.

DETAILED DESCRIPTION OF THE INVENTION

The following discussion is directed to various embodiments of the present invention and while some embodiments can be desirable for specific uses, the disclosed embodiments should not be interpreted or otherwise considered be limit the scope of the present invention, as claimed below. In addition, one skilled in the art will understand that the following disclosure has broader application than is explicitly described.

Definitions

As used herein to define various components of the infrared radiation-sensitive imageable layer, hydrophilic overcoat, and processing solutions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard printed dictionary.

The use of numerical values in the various ranges specified herein, unless otherwise expressly indicated, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless the context indicates otherwise, when used herein, the terms "negative-working, infrared radiation-sensitive lithographic printing plate precursor," "precursor," and "lithographic printing plate precursor" are meant to be equivalent references to embodiments of the present invention.

The term "support" is used herein to refer to an aluminum-containing material (web, sheet, foil, or other form) that can be then treated or coated to prepare a "substrate" that refers to a hydrophilic article having a hydrophilic surface upon which various layers, including the infrared radiation-sensitive imageable layer, and optional hydrophilic overcoat are coated.

As used herein, the term "infrared radiation absorber" refers to compounds or materials that are sensitive to wavelengths of infrared radiation.

As used herein, the term "infrared" refers to radiation having a $\lambda_{max}$ of at least 750 nm and higher. In most instances, the term "infrared" is used to refer to the "near-infrared" region of the electromagnetic spectrum that is defined herein to be at least 750 nm and up to and including 1400 nm.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287-2311 (1996). However, any definitions explicitly set forth herein should be regarded as controlling.

As used herein, the term "polymer" is used to describe compounds with relatively large molecular weights formed by linking together many small reacted monomers. As the polymer chain grows, it folds back on itself in a random fashion to form coiled structures. With the choice of solvents, a polymer can become insoluble as the chain length grows and become polymeric particles dispersed in the solvent medium. These particle dispersions can be very stable and useful in infrared radiation-sensitive imageable layers described for use in the present invention. In this invention, unless indicated otherwise, the term "polymer" refers to a non-crosslinked material. Thus, crosslinked polymeric particles differ from the non-crosslinked polymeric particles in that the latter can be dissolved in certain organic solvents of good solvating property whereas the crosslinked polymeric particles may swell but do not dissolve in the organic solvent because the polymer chains are connected by strong covalent bonds.

Crosslinked polymeric particles are obtained for example by conducting polymerization of the ethylenically unsaturated polymerizable monomers in the presence of multifunctional compounds having two or more polymerizable carbon-carbon double bonds.

The term "copolymer" refers to polymers composed of two or more different repeating or recurring units that are arranged randomly along the polymer backbone.

The term "backbone" refers to the chain of atoms in a polymer to which a plurality of pendant groups can be attached. An example of such a backbone is an "all carbon" backbone obtained from the polymerization of one or more ethylenically unsaturated polymerizable monomers.

The term "arranged randomly" means that blocks of recurring units are not intentionally incorporated into the polymeric binders, but that recurring units are incorporated into the backbone in a random fashion using known polymerization procedures that do not encourage the formation of block copolymers.

Recurring units in polymeric binders described herein are generally derived from the corresponding ethylenically unsaturated polymerizable monomers used in a polymerization process, which ethylenically unsaturated polymerizable monomers can be obtained from various commercial sources or prepared using known chemical synthetic methods.

As used herein, the term "ethylenically unsaturated polymerizable monomer" refers to a compound comprising one or more ethylenic ally unsaturated (—C=C—) bonds that are polymerizable using free radical or acid-catalyzed polymerization reactions and conditions. It is not meant to refer to chemical compounds that have only unsaturated —C=C— bonds that are not polymerizable under these conditions.

Unless otherwise indicated, the term "weight %" refers to the amount of a component or material based on the total solids of a composition, formulation, or layer. Unless otherwise indicated, the percentages can be the same for either a dry layer or the total solids of the formulation or composition.

As used herein, the term "layer" or "coating" can consist of one disposed or applied layer or a combination of several sequentially disposed or applied layers. The layer is considered infrared radiation-sensitive and negative-working it is both sensitive to infrared radiation as described above and negative-working in the formation of lithographic printing plates.

Uses

The present invention is useful for preparing lithographic printing plates by imagewise exposing and processing the exposed precursor with a suitable processing solution described below, in suitable processing apparatus or equipment. In particular, the present invention is useful for preparing lithographic printing plates using exposure to suitable infrared radiation and processing (development) on-press.

Substrate

The substrate that is present in the precursors of the present invention generally has a hydrophilic surface, or at least a surface that is more hydrophilic than the applied infrared radiation-sensitive imageable layer on the imaging side of the substrate. The substrate comprises a support that can be composed of any material that is conventionally used to prepare lithographic printing plate precursors. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports can be modified on one or both flat surfaces with a "subbing" layer to enhance hydrophilicity, or paper supports can be similarly coated to enhance planarity. Examples of subbing layer materials include but are not limited to, alkoxysilanes, amino-propyltriethoxysilanes, glycidioxypropyltriethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

One useful substrate is composed of an aluminum support that can be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful hydrophilic lithographic substrate is an electrochemically grained and sulfuric acid or phosphoric acid anodized aluminum support that provides a hydrophilic surface for lithographic printing.

Sulfuric acid anodization of the aluminum support generally provides an oxide weight (coverage) on the surface of at least 1.5 $g/m^2$ and up to and including 5 $g/m^2$ and more typically at least 3 $g/m^2$ and up to and including 4.3 $g/m^2$. Phosphoric acid anodization generally provides an oxide weight on the surface of from at least 1.5 $g/m^2$ and up to and including 5 $g/m^2$ and more typically at least 1 $g/m^2$ and up to and including 3 $g/m^2$.

An interlayer can be formed by treatment of the aluminum support with, for example, a silicate, dextrin, calcium zirconium fluoride, hexafluorosilicic acid, poly(vinyl phosphonic acid) (PVPA), vinyl phosphonic acid copolymer, poly[(meth)acrylic acid], or acrylic acid copolymer to increase hydrophilicity. Still further, the aluminum support can be treated with a phosphate solution that can further contain an inorganic fluoride (PF). The aluminum support can be electrochemically-grained, sulfuric acid-anodized, and treated with PVPA or PF using known procedures to improve surface hydrophilicity.

A substrate can also comprise a grained and sulfuric acid anodized aluminum-containing support that has also been treated with an alkaline or acidic pore-widening solution to provide its outer surface with columnar pores so that the diameter of the columnar pores at their outermost surface is at least 90% of the average diameter of the columnar pores. This substrate further comprises a hydrophilic layer disposed directly on the grained, sulfuric acid anodized and treated aluminum-containing support, and the hydrophilic layer comprises a non-crosslinked hydrophilic polymer having carboxylic acid side chains. Further details of such substrates and methods for providing them are provided in U.S. Patent Publication 2013/0052582 (Hayashi) that is incorporated herein with respect to the disclosure relating to substrates.

The thickness of the substrate can be varied but should be sufficient to sustain the wear from printing and thin enough to wrap around a printing form. Useful embodiments include a treated aluminum foil having a thickness of at least 100 μm and up to and including 700 μm.

The backside (non-imaging side) of the substrate can be coated with antistatic agents, a slipping layer, or a matte layer to improve handling and "feel" of the imageable element.

Infrared Radiation-Sensitive Imageable Layer

The precursors of the present invention can be formed by suitable application of a negative-working infrared radiation-sensitive composition as described below to a suitable substrate (as described above) to form an infrared radiation-sensitive imageable layer, that is negative-working, on that substrate. In general, the infrared radiation-sensitive composition (and resulting infrared radiation-sensitive imageable layer) comprises a free radically polymerizable component, an infrared radiation absorber, an initiator composition that provides free radicals upon exposure to imaging infrared radiation, a primary polymeric binder, and a secondary crosslinked hydrophilic binder, as the essential components and all of which essential components are described in more detail below. There is generally only a single infrared radiation-sensitive imageable layer in the precursor. It can be the outermost layer in the precursor, but in some embodiments, there is an outermost water-soluble hydrophilic overcoat (also known as a topcoat or oxygen barrier layer) disposed over the one or more negative-working imageable layers. Such outermost water-soluble hydrophilic overcoats are described below.

Many general details of negative-working infrared radiation-sensitive lithographic printing plate precursors are described for example, in EP Patent Publications 770,494A1 (Vermeersch et al.), 924,570A1 (Fujimaki et al.), 1,063,103A1 (Uesugi), EP 1,182,033A1 (Fujimako et al.), EP 1,342,568A1 (Vermeersch et al.), EP 1,449,650A1 (Goto), and EP 1,614,539A1 (Vermeersch et al.), U.S. Pat. No. 4,511,645 (Koike et al.), U.S. Pat. No. 6,027,857 (Teng), U.S. Pat. No. 6,309,792 (Hauck et al.), U.S. Pat. No. 6,569,603 (Furukawa et al.), U.S. Pat. No. 6,899,994 (Huang et al.), U.S. Pat. No. 7,045,271 (Tao et al.), U.S. Pat. No. 7,049,046 (Tao et al.), U.S. Pat. No. 7,261,998 (Hayashi et al.), U.S. Pat. No. 7,279,255 (Tao et al.), U.S. Pat. No. 7,285,372 (Baumann et al.), U.S. Pat. No. 7,291,438 (Sakurai et al.), U.S. Pat. No. 7,326,521 (Tao et al.), U.S. Pat. No. 7,332,253 (Tao et al.), U.S. Pat. No. 7,442,486 (Baumann et al.), U.S. Pat. No. 7,452,638 (Yu et al.), U.S. Pat. No. 7,524,614 (Tao et al.), U.S. Pat. No. 7,560,221 (Timpe et al.), U.S. Pat. No. 7,574,959 (Baumann et al.), U.S. Pat. No. 7,615,323 (Strehmel et al.), U.S. Pat. No. 6,232,038 (Takasaki), U.S. Pat. No. 6,627,380 (Saito et al.), U.S. Pat. No. 6,514,657 (Sakurai et al), U.S. Pat. No. 6,808,857 (Miyamoto et al.), and U.S. Pat. No. 7,672,241 (Munnelly et al.), and U.S. Publication Numbers 2003/0064318 (Huang et al.), 2004/0265736 (Aoshima et al.), 2005/0266349 (Van Damme et al.), 2006/0019200 (Vermeersch et al.), and 2009/0092923 (Hayashi). Some of the noted teachings relate to precursors that can be processed off-press using a suitable processing solution, while others relate to on-press developable precursors. While these publications describe many useful details of various components of the precursors, they do not describe the unique combination of primary polymeric binder and secondary crosslinked hydrophobic binder that are essential to the practice of the present invention.

The infrared radiation-sensitive compositions and infrared radiation-sensitive layers used in precursors include one or more primary polymeric binders, each of which comprises polyalkylenes oxide segments, and optionally pendant cyano groups. Such primary polymeric binders are present in the form of discrete particles (generally non-agglomerated particles). Such primary polymeric binders can be present as discrete particles having an average particle size of at least 10 nm and up to and including 1500 nm, and typically of at least 80 nm and up to and including 600 nm, and that are generally distributed uniformly within the infrared radiation-sensitive imageable layer. Average particle size can be determined by various known methods including measuring the particles in electron microscope images, and averaging a set number of measurements.

In some embodiments, the primary polymeric binder is present in the form of particles having an average particle size that is less than the average dry thickness (t) of the infrared radiation-sensitive imageable layer. The average dry thickness (t) in micrometers (μm) is calculated by the following Equation:

$$t = w/r$$

wherein w is the dry coating coverage of the infrared radiation-sensitive imageable layer in g/m² and r is 1 g/cm³.

For example, the primary polymeric binder can comprise at least 0.05% and up to and including 80%, or more likely at least 10% and up to and including 50%, of the average dry thickness (t) of the infrared radiation-sensitive imageable layer.

Such particulate primary polymeric binders exist at room temperature as discrete particles, for example in an aqueous dispersion, and in the infrared-radiation sensitive imageable layer. Such primary polymeric binders generally have a number average molecular weight ($M_n$) of at least 5,000 and typically at least 20,000 and up to and including 1,000,000, or of at least 30,000 and up to and including 200,000, as determined by Gel Permeation Chromatography.

Useful particulate primary polymeric binders generally include polymeric emulsions or dispersions of polymers having hydrophobic backbones to which are directly or indirectly linked pendant poly(alkylene oxide) side chains (for example at least 10 alkylene glycol units), optionally cyano or phenyl side groups, or both types of side chains or side groups, that are described for example in U.S. Pat. No. 6,582,882 (Pappas et al.), U.S. Pat. No. 6,899,994 (Huang et al.), U.S. Pat. No. 7,005,234 (Hoshi et al.), and U.S. Pat. No. 7,368,215 (Munnelly et al.), and US Patent Publication 2005/0003285 (Hayashi et al.), the disclosures of all of which are incorporated herein by reference with respect to these polymeric binders. More specifically, such primary polymeric binders include but are not limited to, graft copolymers having both hydrophobic and hydrophilic segments, block and graft copolymers having polyethylene oxide (PEO) segments, polymers having both pendant poly(alkylene oxide) segments and cyano groups, in recurring units arranged in random fashion to form the polymer backbone, and various hydrophilic polymeric binders that additionally can have various hydrophilic groups such as hydroxyl, carboxy, hydroxyethyl, hydroxypropyl, amino, aminoethyl, aminopropyl, carboxymethyl, sulfono, or other groups readily apparent to a worker skilled in the art.

The particulate primary polymeric binders also can have a backbone comprising multiple (at least two) urethane moieties as well as pendant groups comprising the polyalkylenes oxide segments. Such primary polymeric binders generally have a number average molecular weight ($M_n$) of at least 2,000 and typically at least 100,000 and up to and including 500,000, or at least 100,000 and up to and including 300,000, as determined by Gel Permeation Chromatography.

In some embodiments of the infrared radiation-sensitive lithographic printing plate precursor of this invention, the primary polymeric binder comprises recurring units comprising polyalkylenes oxide segments and recurring units comprising pendant cyano groups.

Useful primary polymeric binders can be obtained from various commercial sources or they can be prepared using known procedures and starting materials, as described for example in publications described above.

The total primary polymeric binders are present in the infrared radiation-sensitive imageable layer in an amount of at least 10 weight % and up to and including 70 weight %, or more likely in an amount of at least 20 weight % and up to and including 50 weight %, based on the total dry weight of the infrared radiation-sensitive imageable layer.

The infrared radiation-sensitive imageable layer further comprises one or more secondary crosslinked hydrophobic binders in an amount of at least 1 weight % and up to and including 20 weight %, or typically in an amount of at least 1 weight % and up to and including 15 weight %, based on the total dry weight of the infrared radiation-sensitive imageable layer.

Such secondary crosslinked hydrophobic binders are generally in particulate form and have an average particle size of at least 0.2 µm and up to and including 1 µm. For a uniform distribution in the infrared radiation-sensitive imageable layer, the secondary crosslinked hydrophobic binder average particle size can be at least 0.05 µm and up to and including 0.8 µm.

The secondary crosslinked hydrophobic binders can be further described by their hydrophobic nature as indicated by a moisture absorption rate that is defined as the amount of moisture absorption after 5 days in a 40° C./80% relative humidity atmosphere relative to the dry weight of the secondary crosslinked hydrophobic binder measured after complete drying at 50° C. for 3 days. To be useful as a secondary crosslinked hydrophobic binder, the moisture absorption rate is generally less than 2%, or less than 1.5%, or more typically less than 1%. Each secondary crosslinked hydrophobic binder can also be functionalized with amine or carboxylate groups at a level below 2% (by weight) such that the hydrophobic nature of the polymer is maintained.

Useful secondary crosslinked hydrophobic binders useful in this invention are generally obtained by (or derived from) free radical polymerization of one or more multifunctional ethylenically unsaturated polymerizable monomers, each containing two or more ethylenically unsaturated double bonds (or polymerizable groups) per monomer molecule and monofunctional hydrophobic monomers each having one ethylenically unsaturated polymerizable double bond (polymerizable group), using known polymerization procedures such as emulsion polymerization or suspension polymerization procedures. Such processes thereby incorporate appropriate recurring units derived from the noted ethylenically unsaturated polymerizable monomers.

Examples of such multifunctional ethylenically unsaturated polymerizable monomers include but are not limited to, divinylbenzene, 1,3-butanediol dimethacrylate, 1,3-glycerol dimethacrylate, 1,4-phenylene diacrylate, 1,6-hexanedio diacrylate, and 2,2-dimethylpropanediol dimethacrylate.

Ethylenically unsaturated polymerizable monomers that can be co-polymerized with the multifunctional ethylenically unsaturated polymerizable monomers described above include but are not limited to, vinyl acetate, methyl methacrylate, vinyl acetate, N-methyl methacrylamide, 2-ethylhexyl acrylate, 2-methoxyethyl acrylate, 2-n-butoxyethyl methacrylate, benzyl acrylate, methoxy methyl methacrylate, and others that would be readily apparent to one skilled in the art.

Useful secondary crosslinked hydrophobic binders can comprise at least 90 weight % of recurring units derived from one or more monofunctional hydrophobic monomers selected from the group consisting of alkyl (meth)acrylate, cycloalkyl (meth)acrylate, aralkyl (meth)acrylate, aryl (meth)acrylate, (meth)acrylonitrile, styrene, alpha-methyl styrene, vinyl chloride, olefins, and (meth)acrylamide having on the amide nitrogen at least one substituent selected from the group consisting of, alkyl, cycloalkyl, aralkyl, and aryl groups.

Particularly useful secondary crosslinked hydrophobic binders are polymers derived from methyl methacrylate, styrene, and vinyl acetate, one or more of which are co-polymerized with one or both of divinyl benzene and 1,3-butanediol dimethacrylate.

Many ethylenically unsaturated polymerizable monomers useful for preparing the secondary crosslinked hydrophobic binders are available from commercial sources, and others can be readily prepared using known synthetic methods. In some embodiments, the secondary crosslinked hydrophobic binders are themselves commercially available. A skilled polymer chemist would know how to prepare such materials for use in the present invention.

Besides the primary polymeric binders and the secondary crosslinked hydrophobic binders described above, the infrared radiation-sensitive imageable layer can further comprise up to 10 weight %, based on the total dry infrared radiation-sensitive imageable layer weight, of one or more "additional" polymeric binders (different from the primary and secondary binder materials described above). Such one or more additional polymeric binders are polymeric materials that are not within definitions of both the primary polymeric binders and secondary crosslinked hydrophobic binders. Useful embodiments of additional polymeric binders would be readily apparent to one skilled in the art from the numerous publications that describe various polymeric binder materials. Such publications include but are not limited to, EP 1,182,033A1 (Fujimaki et al.) and U.S. Pat. No. 6,309,792 (Hauck et al.), U.S. Pat. No. 6,352,812 (Shimazu et al.), U.S. Pat. No. 6,569,603 (Furukawa et al.), U.S. Pat. No. 8,119,331 (Baumann et al.), U.S. Pat. No. 6,893,797 (Munnelly et al.), U.S. Pat. No. 7,175,949 (Tao et al.), U.S. Pat. No. 7,279,255 (Tao et al.), U.S. Pat. No. 7,326,521 (Tao et al.), and U.S. Pat. No. 7,332,253 (Tao et al.), U.S. Patent Application Publications 2008-0280229 (Tao et al.) and 2009-0142695 (Baumann et al.).

The infrared radiation-sensitive composition (and infrared radiation-sensitive imageable layer) comprises one or more free radically polymerizable components, each of which contains one or more free radically polymerizable groups (and two or more of such groups in some embodiments) that can be polymerized using free radical initiation. In some embodiments, the infrared radiation-sensitive imageable layer comprises two or more free radically polymerizable components having different numbers of free radically polymerizable groups in each molecule.

For example, such free radically polymerizable components can contain one or more free radical polymerizable monomers or oligomers having one or more addition polymerizable ethylenically unsaturated groups (for example, two or more of such groups), crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used. Oligomers or prepolymers, such as urethane acrylates and methacrylates, epoxide acrylates and methacrylates, polyester acrylates and methacrylates, polyether acrylates and methacrylates, and unsaturated polyester resins can be used. In some embodiments, the free radically polymerizable component comprises carboxyl groups.

Free radically polymerizable components include urea urethane (meth)acrylates or urethane (meth)acrylates having multiple (two or more) polymerizable groups. Mixtures of such compounds can be used, each compound having two or more unsaturated polymerizable groups, and some of the compounds having three, four, or more unsaturated polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182,033A1 (Fujimaki et al.), beginning with paragraph [0170], and in U.S. Pat. No. 6,309,792 (Hauck et al.), U.S. Pat. No. 6,569,603 (Furukawa), and U.S. Pat. No. 6,893,797 (Munnelly et al.). Other useful free radically polymerizable components include those described in U.S. Patent Publication 2009/0142695 (Baumann et al.), which radically polymerizable components include 1H-tetrazole groups.

The one or more free radically polymerizable compounds are generally present in an infrared radiation-sensitive imageable composition (and layer) in an amount of at least 10 weight % and up to and including 70 weight %, or typically at least 20 weight % and up to and including 50 weight %, all based on the total solids in the noted composition or layer.

The infrared radiation-sensitive composition (and infrared radiation-sensitive imageable layer) also includes an initiator composition that includes one or more initiators that are capable of generating free radicals sufficient to initiate polymerization of the various free radically polymerizable components upon exposure of the composition to imaging infrared radiation. The initiator composition is generally responsive, for example, to electromagnetic radiation of at least 750 nm and up to and including 1400 nm or at least 750 nm and up to and including 1250 nm. The initiator composition can be designed for any of the noted infrared radiation exposures or for multiple infrared radiation exposures.

Useful initiator compositions can include onium compounds (salts) including ammonium, sulfonium, iodonium, diazonium, and phosphonium compounds, particularly in combination with infrared radiation-sensitive cyanine dyes. Useful iodonium cations are well known in the art including but not limited to, U.S. Patent Publication 2002/0068241 (Oohashi et al.), WO 2004/101280 (Munnelly et al.), and U.S. Pat. No. 5,086,086 (Brown-Wensley et al.), U.S. Pat. No. 5,965,319 (Kobayashi), and U.S. Pat. No. 6,051,366 (Baumann et al.). For example, a useful iodonium cation includes a positively charged iodonium, (4-methylphenyl)[4-(2-methylpropyl)phenyl]-moiety and a suitable negatively charged counterion.

Iodonium cations can be supplied as part of one or more iodonium salts, and the iodonium cations can be supplied as iodonium borates also containing suitable boron-containing anions particularly in combination with infrared radiation-sensitive cyanine dyes. For example, the iodonium cations and the boron-containing anions can be supplied as part of substituted or unsubstituted diaryliodonium salts that are combinations of Structures (I) and (II) described in Cols. 6-8 of U.S. Pat. No. 7,524,614 (Tao et al.).

Useful infrared radiation-sensitive initiator compositions can comprise one or more diaryliodonium borate compounds. Representative iodonium borate compounds useful in this invention include but are not limited to, 4-octyloxy-phenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (penta-fluorophenyl)borate, 4-methylphenyl-4'-dodecylphenyliodonium tetrakis(4-fluorophenyl)borate, bis(dodecylphenyl)-iodonium tetrakis(pentafluorophenyl)-borate, and bis(4-t-butylphenyl)iodonium tetrakis(1-imidazolyl)borate. Useful compounds include bis(4-t-butylphenyl)-iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate. Mixtures of two or more of these compounds can also be used in the initiator composition. U.S. Pat. No. 8,043,787 (Hauck et al.), the disclosure of which is incorporated herein by reference with respect to useful initiator compositions, describes particularly diaryliodonium initiator compositions containing boron-containing anions.

Thus, in some embodiments, the initiator composition that is capable of generating free radicals upon exposure to imaging infrared radiation comprises a diaryliodonium cation and a boron-containing anion, wherein the diaryliodonium cation is represented by the following Structure (IV):

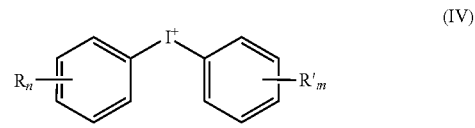

(IV)

wherein R and R' independently represent halogen, nitro, alkyl, aryl, cycloalkyl, alkoxy, aryloxy, alkenyl, alkynyl, alkylamino, dialkylimino, alkylanaido, arylamido, carbonyl, carboxy, sulfonyl, thioalkyl, or thioaryl groups, or two or more of the R and R' groups can be combined to form a fused carbocyclic or heterocyclic ring with respective phenyl groups, and n and m are independently 0 or integers from 1 to 5. The sum of m and n can be 1 to 6. The boron-containing anion is represented by the following Structure (V):

$B^-(R^1)(R^2)(R^3)(R^4)$  (V)

wherein $R^1$, $R^2$, $R^3$, and $R^4$ independently represent alkyl, aryl, alkenyl, alkynyl, cycloalkyl, or heterocyclic groups, or two or more of $R^1$, $R^2$, $R^3$, and $R^4$ can be joined together to form a heterocyclic ring with the boron atom, such rings having up to 7 carbon, nitrogen, oxygen, or nitrogen atoms. In some embodiments, all of the $R^1$, $R^2$, $R^3$, and $R^4$ are the same or different substituted or unsubstituted aryl groups such as substituted or unsubstituted phenyl groups, or more likely all of these groups are unsubstituted phenyl groups, and the sum of m and n can be 1 to 6.

The amount of initiator composition in the infrared radiation-sensitive imageable layer would be readily apparent to one skilled in the art and would be dependent upon the particular components to be used. For example, the initiator composition can be present in an amount of at least 2 weight % and up to and including 20 weight %, or typically at least 4 weight % and up to and including 15 weight %, based on the total solids in the infrared radiation-sensitive composition (or imageable layer).

In addition, the infrared radiation-sensitive composition (and imageable layer) also comprises one or more infrared radiation absorbers to provide desired radiation sensitivity. The total amount of one or more infrared radiation absorbers is at least 0.5 weight % and up to and including 30 weight %, or typically at least 1 weight % and up to and including 15 weight %, based on the infrared radiation-sensitive composition (or imageable layer) total solids.

Some useful infrared radiation absorbers are sensitive to both infrared radiation (typically of at least 700 nm and up to and including 1400 nm) and visible radiation (typically of at least 450 nm and up to and including 700 nm). These compounds also have a tetraaryl pentadiene chromophore. Such chromophore generally includes a pentadiene linking group having 5 carbon atoms in the chain, to which are attached two substituted or unsubstituted aryl groups at each end of the linking group. These aryl groups can be substituted with the same or different tertiary amine groups. The pentadiene linking group can also be substituted with one or more substituents in place of the hydrogen atoms, or two or more hydrogen atoms can be replaced with atoms to form a ring in the linking group as long as there are alternative carbon-carbon single bonds and carbon-carbon double bonds in the chain. Other details of such compounds are provided in U.S. Pat. No. 7,429,445 (Munnelly et al.) the disclosure of which is incorporated herein by reference.

In many embodiments of this invention, the present invention comprises one or more infrared radiation absorbers that are sensitive only to near-infrared or infrared radiation having a wavelength of at least 750 nm. Such useful infrared radiation absorbers include but are not limited to, azo dyes, squarilium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indotricarbocyanine dyes, oxatricarbocyanine dyes, thiocyanine dyes, thiatricarbocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squaraine dyes, oxazole dyes, croconine dyes, porphyrin dyes, and any substituted or ionic form of the preceding dye classes. Suitable dyes are also described in U.S. Pat. No. 5,208,135 (Patel et al.), U.S. Pat. No. 6,153,356 (Urano et al.), U.S. Pat. No. 6,264,920 (Achilefu et al.), U.S. Pat. No. 6,309,792 (Hauck et al.), U.S. Pat. No. 6,569,603 (noted above), U.S. Pat. No. 6,787,281 (Tao et al.), U.S. Pat. No. 7,135,271 (Kawaushi et al.), and EP 1,182,033A2 (noted above). Infrared radiation absorbing N-alkylsulfate cyanine dyes are described for example in U.S. Pat. No. 7,018,775 (Tao). A general description of one class of suitable cyanine dyes is shown by the formula in paragraph [0026] of WO 2004/101280 (Munnelly et al.).

In addition to low molecular weight IR-absorbing dyes, IR dye chromophores bonded to polymers can be used as well. Moreover, IR dye cations can be used as well, that is, the cation is the IR absorbing portion of the dye salt that ionically interacts with a polymer comprising carboxy, sulfo, phospho, or phosphono groups in the side chains.

Near infrared absorbing cyanine dyes are also useful and are described for example in U.S. Pat. No. 6,309,792 (noted above), U.S. Pat. No. 6,264,920 (Achilefu et al.), U.S. Pat. No. 6,153,356 (noted above), and U.S. Pat. No. 5,496,903 (Watanabe et al.). Suitable dyes can be formed using conventional methods and starting materials or obtained from various commercial sources including American Dye Source (Baie D'Urfe, Quebec, Canada) and FEW Chemicals (Germany). Other useful dyes for near infrared diode laser beams are described in U.S. Pat. No. 4,973,572 (DeBoer).

Useful infrared radiation-sensitive compositions with infrared radiation absorbers are also described, for example, in U.S. Pat. No. 7,452,638 (Yu et al.), and U.S. Patent Publications 2008/0254387 (Yu et al.), 2008/0311520 (Yu et al.), 2009/0263746 (Ray et al.), 2010/0021844 (Yu et al.), 2013/0758573 (Balbinot et al.), and 2014/0045118 (Balbinot et al.), the disclosures of all of which are incorporated herein by reference.

Additional additives to the infrared radiation-sensitive imageable layer can include dye precursors and color developers.

Useful dye precursors include but are not limited to, phthalide and fluoran leuco dyes having a lactone skeleton with an acid dissociation property, such as those described in U.S. Pat. No. 6,858,374 (Yanaka), the disclosure of which is incorporated herein by reference. Specific useful examples of dye precursors include Crystal Violet Lactone, Malachite Green Lactone, Benzoyl Leuco Methylene Blue, 3-(N,N-diethylamino)-6-chlor-o-7-(β-ethoxyethylamino)fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzo-fluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide. These compounds can be used individually or as a mixture.

Color developers are meant to include monomeric phenolic compounds, organic acids or metal salts thereof, oxybenzoic acid esters, acid clays, and other compounds described for example in U.S. Patent Publication 2005/0170282 (Imo et al.). The infrared radiation-sensitive imageable layer can also include a variety of other optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. The infrared radiation-sensitive imageable layer can also optionally include a phosphate (meth)acrylate having a molecular weight generally greater than 250 as described in U.S. Pat. No. 7,429,445 (Munnelly et al.) the disclosure of which is incorporated herein by reference.

Hydrophilic Overcoat

While it is not essential, the negative-working infrared radiation-sensitive lithographic printing plate precursor can have a hydrophilic overcoat (or oxygen-barrier layer or topcoat) disposed directly on the negative-working imageable layer (no intermediate layers between these two layers). When present, this hydrophilic overcoat is generally the outermost layer of the precursor and thus, when stacked with other precursors, the hydrophilic overcoat of one precursor would be in contact with the backside of the substrate of the precursor immediately above it.

Such hydrophilic overcoats can comprise one or more film-forming water-soluble polymeric binders in an amount of at least 60 weight % and up to and including 98 weight %, based on the total dry weight of the hydrophilic overcoat.

Such film-forming water-soluble (or hydrophilic) polymeric binders can include a modified or unmodified poly (vinyl alcohol) having a saponification degree of at least 30%, or a degree of at least 75%, or a degree of at least 90%, and a degree of up to and including 99.9%.

For example, the hydrophilic overcoat can include one or more film-forming water-soluble polymeric binders that comprise at least one modified poly(vinyl alcohol) that is modified with at least 0.1 mol % of one or more of the same or different groups selected from the group consisting of acetoacetyl, alkylene, silanol, amino, thioalkyl, glycol, and glycol groups.

Further, one or more acid-modified poly(vinyl alcohol)s can be used as film-forming water-soluble (or hydrophilic) polymeric binders in the hydrophilic overcoat. For example, at least one modified poly(vinyl alcohol) can be modified with an acid group selected from the group consisting of carboxylic acid, sulfonic acid, sulfuric acid ester, phosphonic acid, and phosphoric acid ester groups. Examples of such materials include but are not limited to, sulfonic acid-modified poly (vinyl alcohol), carboxylic acid-modified poly(vinyl alcohol), and quaternary ammonium salt-modified poly(vinyl alcohol), glycol-modified poly(vinyl alcohol), or combinations thereof. Specific commercial examples of the acid-modified poly(vinyl alcohol) include SD 1000 that is available from Kuraray, and Gohsefimer K-210, Gohseran L-3266, Nichigo G-Polymer AZF8035, and Gohseran CKS-50 that are available from Nippon Gohsei.

The hydrophilic overcoat can further comprise one or more other film-forming water-soluble polymers that are not poly (vinyl alcohol)s for example in an amount of at least 2 weight % and up to and including 40 weight %, of a poly (vinyl pyrrolidone), poly(ethyleneimine), poly(vinyl imidazole), poly(vinyl caprolactone), or a random copolymer derived from two or more of vinyl pyrrolidone, ethyleneimine, vinyl caprolactone, vinyl acetate, and vinyl imidazole, and vinyl acetamide.

The hydrophilic overcoat formulations can also include cationic, anionic, amphoteric, or non-ionic wetting agents or surfactants, flow improvers or thickeners, antifoamants, colorants, and biocides. Details about such addenda and useful amounts are provided in WO 99/06890 (Pappas et al.), EP 1,788,429 (Loccufier et al.), and U.S. Patent Publications 2005/0266349 (Van Damme et al.), 2007/0231739 (Koizumi), 2007/0231740 (Yanaka et al.), and 2011/0053085 (Huang et al.).

The hydrophilic overcoat is generally present at a dry coating coverage of at least 0.1 g/m$^2$ and up to but less than 4 g/m$^2$, and typically at a dry coating coverage of at least 0.15 g/m$^2$ and up to and including 2.5 g/m$^2$. In some embodiments, the dry coating coverage is at least 0.1 g/m$^2$ and up to and including 1.5 g/m$^2$ or at least 0.1 g/m$^2$ and up to and including 0.9 g/m$^2$, such that the hydrophilic overcoat layer is relatively thin for easier removal during off-press development or on-press development.

The hydrophilic overcoat can optionally comprise organic wax particles dispersed, generally uniformly, within the one or more film-forming water-soluble (or hydrophilic) polymeric binders as described for example in U.S. Patent Publication 2013/0323643 (Balbinot et al.) the disclosure of which is incorporated herein by reference. These organic wax particles are generally present in an amount of at least 0.05 weight % and up to and including 20 weight %, or in an amount of at least 0.5 weight % and up to and including 10 weight %, all based on the total dry hydrophilic overcoat weight. Useful organic wax particles can be prepared using known procedures as described for example, in WO96/010599 (Soler Codina). Some useful fluorinated and non-fluorinated hydrocarbon wax particles can also be purchased from a number of commercial sources such as Mitsui Chemical Inc. or Münzing Liquid Technologies GmbH.

Negative-Working Infrared Radiation-Sensitive Lithographic Printing Plate Precursors The negative-working infrared radiation-sensitive compositions described above can be applied to a substrate as a solution or dispersion in a coating liquid using any suitable equipment and procedure, such as spin coating, knife coating, gravure coating, die coating, slot coating, bar coating, wire rod coating, roller coating, or extrusion hopper coating. They can also be applied by spraying onto a suitable support. Typically, the negative-working infrared radiation-sensitive composition is applied and dried to form a negative-working infrared radiation-sensitive imageable layer.

Such manufacturing methods can include mixing the various components needed for the imaging chemistry in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and infrared radiation-sensitive imageable layer formulations are described in the Invention Examples below. After proper drying, the dry coating coverage of the negative-working imageable layer is generally at least 0.1 g/m$^2$ and up to and including 4 g/m$^2$ or at least 0.4 g/m$^2$ and up to and including 1.8 g/m$^2$.

Distinct non-imageable layers can also be present under the infrared radiation-sensitive imageable layer and disposed directly on the hydrophilic substrate to enhance developability or to act as thermal insulating layers.

In some embodiments, a suitable aqueous-based hydrophilic overcoat formulation (as described above) can be applied to the dried infrared radiation-sensitive imageable layer in a suitable manner, and then dried as described below. In such instances, the dry coverage of the hydrophilic overcoat is generally as described above.

Once the various layers have been applied and dried on the substrate, the negative-working infrared radiation-sensitive lithographic printing plate precursors can be enclosed in water-impermeable material that substantially inhibits the transfer of moisture to and from the element and "heat conditioned" as described in U.S. Pat. No. 7,175,969 (noted above).

The lithographic printing plate precursors can be stored and transported as stacks of precursors within suitable packaging and containers known in the art, and interleaf papers can be present between the adjacent precursors in the stacks, or in some embodiments, such interleaf papers can be omitted.

Imaging (Exposing) Conditions

During use, a negative-working infrared radiation-sensitive lithographic printing plate precursor of this invention can be exposed to a suitable source of exposing radiation depending upon the infrared radiation absorber present in the infrared radiation-sensitive imageable layer to provide specific sensitivity that is at a wavelength of at least 750 nm and up to and including 1400 nm, or of at least 800 nm and up to and including 1250 nm using an appropriate energy source.

For example, imaging can be carried out using imaging or exposing radiation from an infrared radiation-generating laser (or array of such lasers). Imaging also can be carried out using imaging radiation at multiple wavelengths at the same time if desired. The laser used to expose the precursor is usually a diode laser, because of the reliability and low maintenance of diode laser systems, but other lasers such as gas or solid-state lasers can also be used. The combination of power, intensity and exposure time for infrared radiation laser imaging would be readily apparent to one skilled in the art.

The imaging apparatus can be configured as a flatbed recorder or as a drum recorder, with the negative-working infrared radiation-sensitive lithographic printing plate precursor mounted to the interior or exterior cylindrical surface of the drum. An example of useful imaging apparatus are available as models of KODAK® Trendsetter platesetters (Eastman Kodak Company) that contain laser diodes that emit near infrared radiation at a wavelength of about 830 nm. Other suitable imaging apparatus includes the Crescent 42T Platesetter that operates at a wavelength of 1064 nm (available from Gerber Scientific, Chicago, Ill.) and the Screen PlateRite 4300 series or 8600 series platesetter (available from Screen USA, Chicago, Ill.) that operates at a wavelength of 810 nm.

Imaging with infrared radiation can be carried out generally at imaging energies of at least 30 mJ/cm$^2$ and up to and including 500 mJ/cm$^2$ and typically at least 50 mJ/cm$^2$ and up to and including 300 mJ/cm$^2$ depending upon the sensitivity of the infrared radiation-sensitive imageable layer.

While infrared radiation laser imaging is desired in the practice of this invention, thermal imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Processing (Development) and Printing

After imagewise exposing, the exposed negative-working, infrared radiation-sensitive lithographic printing plate precursors can be processed "off-press" using suitable one or more successive applications (treatments or developing steps) of the same or different processing solutions as described below. Such one or more successive processing treatments can be carried out with exposed precursors for a time sufficient to remove the non-exposed regions of the imaged infrared radiation-sensitive imageable layer and outermost hydrophilic overcoat, if present, to reveal the hydrophilic surface of the substrate, but not long enough to remove significant amounts of the exposed regions that have been hardened in the same layer. The revealed hydrophilic substrate surface repels inks while the exposed regions accept lithographic printing ink. Thus, the non-exposed regions to be removed are "soluble," "dispersible," or "removable" in the processing solution because they are dissolved, dispersed, or removed within it more readily than the regions that are to remain.

Prior to such processing, the exposed precursors can be subjected to a "pre-heating" process to further harden the exposed regions in the infrared radiation-sensitive imageable layer. Such optional pre-heating can be carried out using any known process and equipment generally at a temperature of at least 60° C. and up to and including 180° C.

Following this optional pre-heating, or in place of the pre-heating, the exposed precursor can be washed (rinsed) to remove any hydrophilic overcoat that is present. Such optional washing (or rinsing) can be carried out using any suitable aqueous solution (such as water or an aqueous solution of a surfactant) at a suitable temperature and for a suitable time that would be readily apparent to one skilled in the art.

One or more successive treatments by processing (development) off-press can be accomplished using what is known as "manual" development, "dip" development, or processing with an automatic development apparatus (processor) using one or more processing stations. In the case of "manual" development, processing can be conducted by rubbing the entire exposed precursor with a sponge or cotton pad sufficiently impregnated with the processing solution (as described below). "Dip" development involves dipping the exposed precursor in a tank or tray containing a processing solution for at least 10 seconds and up to and including 60 seconds (especially at least 20 seconds and up to and including 40 seconds) under agitation. The use of automatic development apparatus is well known and generally includes pumping a processing solution into a developing tank or ejecting it from spray nozzles. The apparatus can also include a suitable rubbing mechanism (for example one or more brushes or rollers) and a suitable number of conveyance rollers. Some developing apparatus include laser exposure means and the apparatus is divided into an imaging section and one or more processing sections. Manual processing is less desirable than use of a processing apparatus of some type.

For example, a processing solution can be applied in one or more successive applications to an exposed precursor by rubbing, spraying, jetting, dipping, immersing, slot die coating (for example see FIGS. 1 and 2 of U.S. Pat. No. 6,478,483 of Maruyama et al.) or reverse roll coating (as described in FIG. 4 of U.S. Pat. No. 5,887,214 of Kurui et al.), or by wiping the exposed precursor with the processing solution or contacting it with a roller, impregnated pad, or applicator. For example, the exposed precursor can be brushed with one or more successive applications of a processing solution, or a processing solution can be successively poured onto or applied by spraying the exposed precursor surface with sufficient force to remove the non-exposed regions using a spray nozzle system (or spray bar) as described for example in [0124] of EP 1,788,431 A2 (noted above) and U.S. Pat. No. 6,992,688 (Shimazu et al.). As noted above, the exposed precursor can be immersed in one or more successive baths of a processing solution and rubbed by hand or with an apparatus. To assist in the removal of any back side coating, a brush roller or other mechanical component can be placed in contact with the back side coating during processing.

If successive applications are desired, a processing solution can be successively applied to the exposed precursor in one or more successive processing units (or stations) of a suitable processing apparatus ("processor") that has at least one brush roller for rubbing or brushing the exposed precursor. Residual processing solution can be removed for example, using a squeegee or nip rollers, or left on the resulting lithographic printing plate without any rinsing step.

Excess amounts of processing solution can be collected in a tank and used several times, and replenished if necessary from a reservoir.

The processing solution can be replenished using any suitable means and at a desired time. In the case of dip tank and spray bar arrangements in processing apparatus, the processing solution can be replenished with replenisher having the same concentration of the original processing solution. It is also possible to replenish the processing solution with a more concentrated or more dilute form of the processing solution. Another option is to replenish the processing solution with water. The chosen method of replenishment depends upon the type of exposed precursor to be processed, the chosen processing solution (for example, chosen buffer capacity, solids content, viscosity, and other properties), and the construction of the processing apparatus (for example, amount of evaporation in a given processing mode or use of preheating).

One or multiple (for example two) successive processing steps can be carried out at any suitable temperature and "dwell time" (time of contact with the processing solution in one or more processing stations). For example, the exposed precursor can be contacted with a processing solution described below, each individual (distinct) application or contact being carried out independently at a temperature of at least 20° C. and up to and including 40° C. Each individual contacting or treatment can be carried out, for example, in a dip tank or spray bar processor at a temperature of at least 20° C. and up to and including 40° C. optionally while using at least one rotating brush in each processing station.

Processing Solution:

A processing solution is used to process (develop) the exposed precursor in one or more applications (one or more treatments). As noted above, in some embodiments, only one application of processing solution is used, but in other embodiments, multiple successive applications are used, for example two successive applications of the processing solutions. The term "successive" means that there are no intermediate rinsing steps between two distinct (independent) processing applications, but there can be an intermediate drying step (using hot air or other conditions described below) between any two successive applications of processing solution.

In all embodiments of the present invention, the processing solution (whether a single application or multiple applications) has a pH of at least 3 and up to and including 12, or more likely equal to or less than 10. The pH can be achieved and maintained using suitable amounts of components that are used to adjust and maintain pH as would be known in the art.

Both aqueous alkaline developers and organic solvent-containing developers or processing solutions can be used. Some useful processing solutions are described for example, in U.S. Pat. No. 7,507,526 (Miller et al.) and U.S. Pat. No. 7,316,894 (Miller et al.) the disclosures of which are incorporated herein by reference. Processing solutions can include surfactants, chelating agents (such as salts of ethylenediaminetetraacetic acid), organic solvents (such as benzyl alcohol), and alkaline components (such as inorganic metasilicates, organic metasilicates, hydroxides, and bicarbonates).

Organic solvent-containing developers are generally single-phase processing solutions of one or more organic solvents that are miscible with water. Useful organic solvents include the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of at least 0.5% and up to and including 15% based on total developer weight. The organic solvent-containing developers can be neutral, alkaline, or slightly acidic in pH. Representative organic solvent-containing developers include ND-1 Developer, Developer 980, Developer 1080, Developer 1090, 2 in 1 Developer, 955 Developer, D29 Developer (described below), Developer SP500, Developer 206, and 956 Developer (all available from Eastman Kodak Company).

In addition, the processing solution can further comprise at least one compound selected from the group consisting of a nonionic surfactant, an anionic surfactant, a neutrally-charged hydrophilic compound other than a nonionic or anionic surfactant, and a hydrophilic film-forming polymer. Such processing solutions an also comprise one or more alkanolamines, organic phosphonic acids (or salts thereof), or polycarboxylic acids (or salts thereof).

In some instances, an aqueous processing solution can be used to both develop the imaged precursor by removing the non-exposed regions of the negative-working imageable layer and also to provide a protective layer or coating over the entire imaged and developed (processed) precursor printing surface. In this embodiment, the aqueous alkaline solution behaves somewhat like a gum that is capable of protecting (or "gumming") the lithographic image on the printing plate against contamination or damage (for example, from oxidation, fingerprints, dust, or scratches). Such processing solutions generally have a pH of at least 2 and up to and including 11.5, and typically of at least 6 and up to and including 11, or of at least 6 and up to and including 10.5, as adjusted using a suitable amount of an acid or base. Such aqueous processing solution generally includes a basic compound such as an organic amine having a boiling point of less than 300° C. (and typically of at least 50° C.) or an alkaline earth/alkali carbonate buffer or an amino acid buffer, a film-forming hydrophilic polymer, and optionally an anionic, amphoteric, or nonionic surfactant. Tap water can be used to make up the solution and generally provides at least 45 and up to and including 98 weight % of the total processing solution weight.

Useful organic amines are relatively volatile organic primary, secondary, and tertiary amines that include but are not limited to, alkanolamines (including cycloalkyl amines), carbocyclic aromatic amines, and heterocyclic amines, that are present in a total amount of at least 0.1 weight % based on total processing solution weight. Useful amines are mono-, di- and trialkanol amines such as monoethanolamine, diethanolamine, triethanolamine, and mono-n-propanolamine, or combinations of these compounds.

One or more film-forming water-soluble or hydrophilic compounds can be present in the processing solution in an amount of at least 0.25 weight % and up to and including 30 weight % and typically at least 1 weight % and up to and including 15 weight %, based on total processing solution weight. Examples of useful hydrophilic compounds of this type include hydrophilic polymers as well as non-polymeric hydrophilic compounds (molecular weight of less than 1,000) that are not nonionic or anionic surfactants. Useful non-polymeric and polymeric hydrophilic compounds include but are not limited to, gum arabic, gluconic acid, pullulan, cellulose derivatives (such as hydroxymethyl cellulose, carboxymethyl-cellulose, carboxyethylcellulose, and methyl cellulose), starch derivatives [such as (cyclo)dextrins, starch esters, dextrins, carboxymethyl starch, and acetylated starch] poly(vinyl alcohol), poly(vinyl pyrrolidone), polyhydroxy compounds [such as polysaccharides, sugar alcohols such as sorbitol, miso-inosit, homo- and copolymers of (meth)acrylic acid or (meth)acrylamide], copolymers of vinyl methyl ether and maleic anhydride, copolymers of vinyl acetate and maleic anhydride, copolymers of styrene and maleic anhydride, and copolymers having recurring units with carboxy, sulfa, or phospho groups, or salts thereof.

The aqueous processing solution optionally includes one or more anionic, amphoteric, or nonionic surfactants (or both) in an amount of at least 0.25 weight % and up to and including 50 weight %, and typically at least 0.25 weight % and up to and including 30 weight % based on the total processing solution weight. Useful anionic surfactants include those with carboxylic acid, sulfonic acid, or phosphonic acid groups (or salts thereof). Anionic surfactants having sulfonic acid (or salts thereof) groups are particularly useful. Alkyldiphenyloxide disulfonates (such as sodium dodecyl phenoxy benzene disulfonates), alkylated naphthalene sulfonic acids, sulfonated alkyl diphenyl oxides, and methylene dinaphthalene sulfonic acids) are particularly useful anionic surfactants.

Examples of useful nonionic surfactants include but are not limited to, polyoxyethylene alkyl ethers, polyoxyethylene phenyl ethers, polyoxyethylene 2-naphthyl ethers, polyoxyethylene alkyl phenyl ethers, polyoxyethylene polystyryl phenyl ethers, polyoxyethylene polyoxypropylene alkyl ethers, polyoxyethylene polyoxypropylene block polymers, partial esters of glycerin-aliphatic acids, partial esters of sorbitan aliphatic acid, partial esters of pentaerythritol aliphatic acid, propylene glycol monoaliphatic esters, partial esters of sucrose aliphatic acids, partial esters of polyoxyethylene sorbitanaliphatic acid, partial esters of polyoxyethylene sorbitol aliphatic acids, polyethyleneglycol aliphatic esters, partial esters of polyglycerin aliphatic acids, poly-oxyethylenated castor oils, partial esters of polyoxyethylene glycerin aliphatic acids, aliphatic diethanolamides, N,N-bis-2-hydroxyalkylamines, polyoxyethylene alkylamines, triethanolamine aliphatic esters, alkoxylated aromatic compounds and trialkylamine oxides. Particularly preferred among these nonionic surfactants are alkoxylated aromatic compounds like polyoxyethylene phenyl ethers, polyoxyethylene-2-naphthyl ethers as disclosed in EP 1,172,699A (Tsuchiya et al.), and polyoxyethylene di-styryl phenyl ether and polyoxyethylene tri-styryl phenyl ether as disclosed in EP 1,722,275A (Gries et al.).

Useful amphoteric surfactants include but are not limited to, N-alkylamino acid triethanol ammonium salts, cocamidopropyl betaines, cocamidoalkyl glycinates, sodium salt of a short chain alkylaminocarboxylate, N-2-hydroxyethyl-N-2-carboxyethyl fatty acid amidoethylamine sodium salts, and carboxylic acid amidoetherpropionates; such as cocamidopropylbetaines.

Useful cationic surfactants include but are not limited to, tetraalkyl ammonium chlorides such as tetrabutyl ammonium chloride and tetramethyl ammonium chloride, and polypropoxylated quaternary ammonium chlorides.

Additional optional components of the aqueous processing solutions used in this invention include but are not limited to, antifoaming agents, buffers, biocides, complexing agents, and small amounts of water-miscible organic solvents such as reaction products of phenol with ethylene oxide and propylene oxide, benzyl alcohol, esters of ethylene glycol and propylene glycol with acids having 6 or less carbon atoms, sludge inhibitors (such as filter dyes and free-radical inhibitors), odorants, anti-corrosion agents, and dyes, all in known amounts.

The processing solution can also include chelating agents (such as salts of ethylenediaminetetraacetic acid), and alkaline components (such as inorganic metasilicates, organic metasilicates, hydroxides, and bicarbonates) although such alkaline components are not particularly desirable unless used with amino acids described above. Inorganic and organic silicates and metasilicates are omitted from some processing solutions. Such processing solutions are free of silicates and metasilicates (none purposely added to the processing solutions or less than 0.1 weight % is present).

It is optional but desirable in some embodiments that the exposed and processed precursor be dried before it is mounted onto a printing press. Drying can be accomplished using any suitable method and drying means such as using hot air at a temperature of at least 40° C. and up to and including 150° C., or a drying oven maintained as a suitable temperature. The drying means can be a distinct section or station in a processing apparatus, or it can be a separate apparatus.

After the described processing and optional drying, the resulting lithographic printing plate can be mounted onto a printing press without any contact with additional solutions or liquids when a protective coating is provided with the processing solution. It is particularly advantageous that the traditional separate gumming and rinsing operations can be avoided between the last application of processing solution and mounting the resulting lithographic printing plate onto a printing press for lithographic printing because the processing solution can be designed to provide gumming during the expected processing.

It is optional to further bake the lithographic printing plate with or without blanket or floodwise exposure to UV or visible radiation. Alternatively, a blanket UV or visible radiation exposure can be carried out, without a postbake operation. Postbaking the exposed and processed lithographic printing plate can be carried out at a temperature of at least 180° C. for at least 10 seconds or at a temperature of at least 180° C. and up to and including 300° C. for at least 10 seconds and up to and including 10 minutes.

Printing:

Printing can be carried out by putting the exposed and processed lithographic printing plate on a suitable printing press. The lithographic printing plate is generally secured in the printing press using suitable clamps or other holding devices. Once the lithographic printing plate is secured in the printing press, printing can be carried out by applying a lithographic printing ink and fountain solution to the printing surface of the lithographic printing plate in a suitable manner. The fountain solution is taken up by the surface of the hydrophilic substrate revealed by the exposing and processing steps, and the lithographic ink is taken up by the remaining (exposed) regions of the imageable layer. The lithographic ink is then transferred to a suitable receiving material (such as cloth, paper, metal, glass, or plastic) to provide a desired impression of the image thereon. If desired, an intermediate "blanket" roller can be used to transfer the lithographic ink from the lithographic printing plate to the receiving material (for example, sheets of paper). The lithographic printing plates can be cleaned between impressions, if desired, using conventional cleaning means.

On-Press Development and Printing:

For the imaged negative-working infrared radiation-sensitive lithographic printing plate precursors that are designed for on-press development, the imaged precursor is mounted on-press wherein the non-exposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142 W+Varn PAR (alcohol sub) (available from Varn International, Addison, Ill.).

In a typical printing press startup with a sheet-fed printing machine, the dampening roller is engaged first and supplies fountain solution to the mounted imaged precursor to swell the exposed infrared radiation-sensitive imageable layer at least in the non-exposed regions. After a few revolutions (typically 5 to 20 revolutions), the inking rollers are engaged and they supply lithographic printing ink(s) to cover the entire printing surface of the lithographic printing plates. Typically, within 5 to 20 revolutions after the inking roller engagement, printing sheets are supplied to remove the non-exposed regions of the infrared radiation-sensitive imageable layer as well as materials on a blanket cylinder if present, using the formed ink-fountain emulsion.

The present invention provides at least the following embodiments and combinations thereof, but other combinations of features are considered to be within the present invention as a skilled artisan would appreciate from the teaching of this disclosure:

1. A negative-working, infrared radiation-sensitive lithographic printing plate precursor comprising:
   a substrate having a hydrophilic surface,
   an infrared radiation-sensitive imageable layer that is disposed on the hydrophilic surface of the substrate, and comprises:
   a free radically polymerizable compound;
   an initiator composition that provides free radicals upon exposure of the infrared radiation-sensitive imageable layer to infrared radiation;
   an infrared radiation absorber;
   a primary polymeric binder comprising polyalkylenes oxide segments and optionally pendant cyano groups and is present in the form of particles; and
   a secondary crosslinked hydrophobic binder that is present in an amount of at least 1 weight % and up to and including 20 weight % based on the total dry weight of the infrared radiation-sensitive imageable layer, and
   optionally, a hydrophilic overcoat as the outermost layer.

2. The negative-working, infrared radiation-sensitive lithographic printing plate precursor of embodiment 1, wherein the primary polymeric binder comprises recurring units comprising polyalkylenes oxide segments and recurring units comprising pendant cyano groups.

3. The negative-working, infrared radiation-sensitive lithographic printing plate precursor of embodiment 1 or 2, wherein the primary polymeric binder is present in the infrared radiation-sensitive imageable layer in an amount of at least 10 weight % and up to and including 70 weight %, based on the total dry weight of the infrared radiation-sensitive imageable layer.

4. The negative-working, infrared radiation-sensitive lithographic printing plate precursor of any of embodiments 1 to 3, wherein the primary polymeric binder is present in the form of particles having an average particle size that is less than the average dry thickness of the infrared radiation-sensitive imageable layer.

5. The negative-working, infrared radiation-sensitive lithographic printing plate precursor of any of embodiments 1 to 4, wherein the primary polymeric binder is at least 0.05% and up to and including 80% of the average dry thickness (t) of the infrared radiation-sensitive imageable layer.

6. The negative-working lithographic printing plate precursor of any of embodiments 1 to 5, wherein the secondary crosslinked hydrophobic binder is present in an amount of at least 1 weight % and up to and including 15 weight %, based on the total dry weight of the infrared radiation-sensitive imageable layer.

7. The negative-working lithographic printing plate precursor of any of embodiments 1 to 6, wherein the secondary crosslinked hydrophobic binder has a moisture absorption rate of less that 2%.

8. The negative-working lithographic printing plate precursor of any of embodiments 1 to 7, wherein the secondary crosslinked hydrophobic binder has a moisture absorption rate of less that 1%.

9. The negative-working lithographic printing plate precursor of any of embodiments 1 to 8, wherein the infrared radiation-sensitive imageable layer is present at a dry coverage of at least 0.4 g/m$^2$ and up to and including 1.8 g/m$^2$.

10. The negative-working lithographic printing plate precursor of any of embodiments 1 to 9, wherein the secondary crosslinked hydrophobic binder is provided as particles having an average particle size of at least 0.2 μm and up to and including 1 μm.

11. The negative-working lithographic printing plate precursor of any of embodiments 1 to 10, wherein the secondary crosslinked hydrophobic binder comprises recurring units derived from one or more multifunctional monomers comprising two or more ethylenically unsaturated polymerizable groups per molecule, and recurring units derived from one or more monofunctional hydrophobic monomers having one ethylenically unsaturated polymerizable group per molecule.

12. The negative-working lithographic printing plate precursor of embodiment 11, wherein the secondary crosslinked hydrophobic binder comprises at least 90 weight % of recurring units derived from monofunctional hydrophobic monomers selected from the group consisting of alkyl (meth)acrylate, cycloalkyl (meth)acrylate, aralkyl (meth)acrylate, aryl (meth)acrylate, (meth)acrylonitrile, styrene, alpha-methyl styrene, vinyl chloride, olefins, and (meth)acrylamide having on the amide nitrogen at least one substituent selected from the group consisting of, alkyl, cycloalkyl, aralkyl, and aryl.

13. A method for providing a lithographic printing plate, the method comprising:
   imagewise exposing the negative-working, infrared radiation-sensitive lithographic printing plate precursor of any of embodiments 1 to 12 to infrared radiation to provide exposed regions and non-exposed regions in the infrared radiation-sensitive imageable layer, and
   removing the non-exposed regions in the infrared radiation-sensitive imageable layer from the substrate to provide a lithographic printing plate.

14. The method of embodiment 13, comprising removing the non-exposed regions on-press using a fountain solution, lithographic printing ink, or both fountain solution and lithographic printing ink.

15. The method of embodiment 13, comprising removing the non-exposed regions off-press using an aqueous alkaline solution having a pH equal to or less than 10.

16. The method of embodiment 15, wherein the aqueous alkaline solution is free of silicates and metasilicates.

17. The method of embodiment 15 or 16, wherein the aqueous alkaline solution also provides a protective coating over the lithographic printing plate, and the lithographic printing plate is not further treated or rinsed before being used for lithographic printing.

The following Examples are provided to illustrate the practice of this invention and are not meant to be limiting in any manner. The following materials are used in these Examples:

The IR Dye A has a structure are given below:

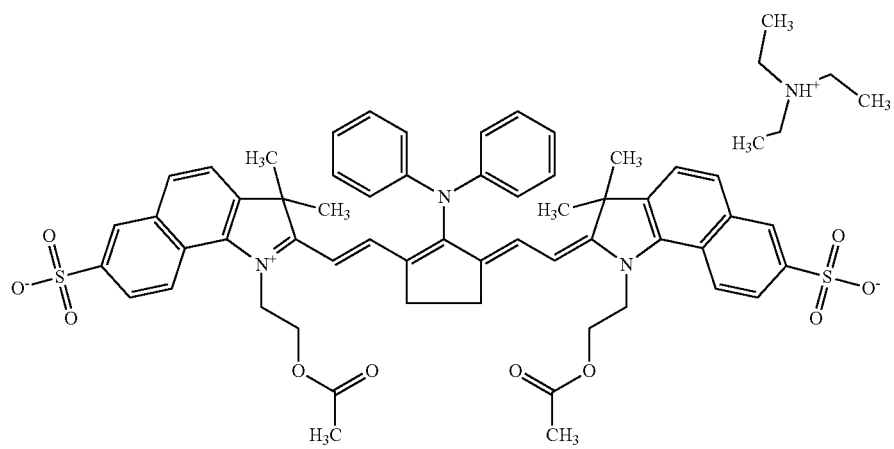

BYK® 302 surfactant was obtained from Byk Chemie (Wallingford, Conn.) at 25 weight % in DOWANOL® PM solvent.

DYE PRECURSOR A is 3-(N-ethyl-N-isopenylamino)-6-methyl-7-anilinofluoran.

Copolymer A is a latex polymer derived by free radical polymerization from PEGMA, acrylonitrile, and styrene at a 10:70:20 weight ratio in 80:20 propanol:water reaction medium. PEGMA represents poly(ethylene glycol) methyl ether methacrylate (available as a 50 weight % solution in water, average $M_n$ of 2080).

KLUCEL® E is a hydroxypropyl cellulose that was obtained from Hercules Inc. (Wilmington, Del.).

Poly(methyl methacrylate) was obtained by free radical polymerization of methyl methacrylate.

Borate A is represented by the following formula:

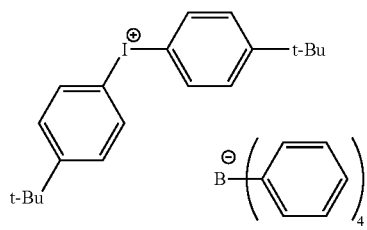

wherein t-Bu refers to a t-butyl group.

Mercapto-3-triazole (or 2-mercatotriazole) can be obtained from PCAS (Paris, France).

Iodonium A is (4,-methylphenyl)[4-(2-methylpropyl)phenyl] iodonium hexafluorophosphate.

IRGANOX® 1035 (BASF, Germany) comprises thiodiethylene bis[3-[3,5-di-t-butyl-4-hydroxyphenyl]propionate].

BPE-10 is ethoxylated bisphenol A diacrylate from Shin Nakamura (Japan).

Oligomer A is a urethane acrylate prepared by reacting Desmodur® N100 (an aliphatic polyisocyanate resin based on hexamethylene diisocyanate from Bayer Corp., Milford, Conn.) with hydroxyethyl acrylate and pentaerythritol triacrylate (80 weight % in 2-butanone).

CP1 is BMSA-GN, crosslinked poly(methyl methacrylate) particles having average particle size of less than 0.8 μm were obtained from Seksui (Japan).

CP2 and CP3 are PPX-05-10 and PPX-08-10, crosslinked polystyrene Particles having average particle sizes of 0.4-0.6 μm and 0.7-0.9 μm, respectively (Spherotech, USA).

Varn Supreme 6038/2.3% PAR (Varn) are press room chemical available from Varn, USA.

Gans Hi-Tac Cyan Ink is a cyan ink available from Gans Ink & Supply Co. Inc. USA.

HYBRIDUR® 578 and HYBRIDUR® 580 are anionically-stabilized acrylic-urethane hybrid polymer dispersions (Air Products & Chemicals).

PVP K-15 is a poly(vinyl pyrrolidone) (Ashland, Germany).

Substrate A is an electrochemically-grained and phosphoric acid-anodized aluminum support, with an oxide weight of 1.2 g/m², which has been coated with a poly(acrylic acid) subbing layer at a dry coverage of 0.3 g/m².

Solvent Mixture A is a mixture of n-propanol/methyl ethyl ketone/PGME/Water/BLO at a weight ratio of 39/40/10/10/1.

PGME refers to propylene glycol monomethyl ether.

BLO refers to γ-butyrolactone.

Examples:

Each infrared radiation-sensitive imageable layer in Invention Examples 1-5 and Comparative Examples 1-3 was obtained by dissolving the components shown below in TABLE I in a Solvent Mixture A and coating the formulation onto a sample of Substrate A using a bar coater, followed by drying for 60 seconds at about 50° C. to provide a dry coating weight of about 1 g/m² to form a negative-working, infrared radiation-sensitive lithographic printing plate precursor.

TABLE I

| | Invention Example 1 | Comparative Example 1 | Invention Example 2 | Comparative Example 2 | Comparative Example 3 | Invention Example 3 | Invention Example 4 | Invention Example 5 |
|---|---|---|---|---|---|---|---|---|
| Oligomer A | 26.67% | 26.67% | 26.67% | 26.67% | 26.67% | 26.67% | 26.67% | 26.67% |
| BPE-10 | 13.33% | 13.33% | 13.33% | 13.33% | 13.33% | 13.33% | 13.33% | 13.33% |
| KLUCEL ® E | 2.00% | 2.00% | 3.50% | 3.50% | 5.00% | 2.00% | 1.00% | 2.00% |
| Iodonium A | 5.25% | 5.25% | 5.25% | 5.25% | 5.25% | 5.25% | 5.25% | 5.25% |
| 3-Mercaptotriazole | 2.78% | 2.78% | 2.78% | 2.78% | 2.78% | 2.78% | 2.78% | 2.78% |

TABLE I-continued

|  | Invention Example 1 | Comparative Example 1 | Invention Example 2 | Comparative Example 2 | Comparative Example 3 | Invention Example 3 | Invention Example 4 | Invention Example 5 |
|---|---|---|---|---|---|---|---|---|
| Borate A | 4.75% | 4.75% | 4.75% | 4.75% | 4.75% | 4.75% | 4.75% | 4.75% |
| DYE PRECURSOR A | 4.60% | 4.60% | 4.60% | 4.60% | 4.60% | 4.60% | 4.60% | 4.60% |
| IR Dye A | 4.00% | 4.00% | 4.00% | 4.00% | 4.00% | 4.00% | 4.00% | 4.00% |
| Poly(methyl methacrylate) |  | 3.00% |  | 1.50% |  |  |  |  |
| Crosslinked polymer particles (%) | CP1 (3%) |  | CP1 (1.5%) |  |  | CP2 (3%) | CP2 (4%) | CP3 (3%) |
| IRGANOX ® 1035 | 0.50% | 0.50% | 0.50% | 0.50% | 0.50% | 0.50% | 0.50% | 0.50% |
| Copolymer A | 30.85% | 30.85% | 30.85% | 30.85% | 30.85% | 30.85% | 30.85% | 30.85% |
| BYK ® 302 | 2.27% | 2.27% | 2.27% | 2.27% | 2.27% | 2.27% | 2.27% | 2.27% |
| Total | 100.00% | 100.00% | 100.00% | 100.00% | 100.00% | 100.00% | 100.00% | 100.00% |

Imaging:

Each negative-working, infrared radiation-sensitive lithographic printing plate precursor was exposed on a Trendsetter 800 II Quantum Platesetter (Eastman Kodak Company) with a power series with solids at an energy of from 23 mJ/cm$^2$ to 70 mJ/cm$^2$ at 2 mJ/cm$^2$ steps and with a test target at a fixed energy of 150 mJ/cm$^2$ to evaluate the resolution of each resulting lithographic printing plate. The test target is made up of 20 squares having 70% tint at 200 lpi and a pixel dial comprising a range of pixel patterns starting from 4×4 pixels up to 12×12 pixels.

Press Test:

Each exposed precursor was directly mounted onto a MAN Roland 04 printing press charged with Gans Hy Tac Cyan Ink and 2.3% Varn Supreme 6038/2.3% PAR (Varn) fountain solution. The printing press was then started and the dampening system was engaged to wet each lithographic printing plate with fountain solution. After five revolutions of dampening, the inking system was engaged and again after 5 revolutions with lithographic printing ink, 1000 copies (impressions) were printed with each lithographic printing plate.

Artificial Aging:

These tests were done to simulate real time aging. The Artificial Aging tests are conducted for 5 days at 40° C. and 80% RH while unwrapped or 3 days at 50° C. dry heat while wrapped.

Speedpoint:

To measure the speedpoint, the optical densities (OD) of the solid strips of the power series on the 1000$^{th}$ printed sheet as measured using a Techkon Spectrodens were plotted against the exposure energy. Speedpoint is defined as the exposure energy at which 80% of the OD$_{max}$ value of the 150 mJ/cm$^2$ strip is achieved. A lithographic printing plate that had a Speedpoint of less than 42 mJ/cm$^2$ was considered to be sufficiently infrared radiation-sensitive to achieve a maximum run length at the exposure energy of 150 mJ/cm$^2$.

Development of Press Assessment (DOP):

The printed sheets were assessed for the number of printed sheets needed to print a clean background (DOP) and general image quality. The DOP was considered good when the fresh lithographic printing plate precursors required less than 20 sheets to give clean copies and the aged lithographic printing plate precursors required less than 50 sheets to give clean copies.

Ink Receptivity:

Ink Receptivity is defined as the first sheet showing the full ink density measuring an OD of 1.2 (using a Techkon Spectrodens) in the infrared radiation exposed regions, while showing a clean background in the non-exposed regions.

Resolution:

The resolution in the 70% tint was evaluated under a Lupe on the 20$^{th}$, 50$^{th}$, and 100$^{th}$ sheet obtained from each lithographic printing plate by counting the number of patches of the 20 patches that had no plugging in the shadows. The resolution in the pixel patches was similarly evaluated by checking under a Lupe the lowest pixel patch that had no plugging in the shadows.

Run Length:

A run length test was conducted using a Varn Supreme Fount (3.5%) & IPA (8%) & Rapida Process Black lithographic ink. Each lithographic printing plate was exposed at 150 mJ/cm$^2$ using a Trendsetter 800. The image wear of the solids and the fine elements at various resolutions in both AM and FM screen were then evaluated. Run length was considered to be completed when the dot sharpening of the 50% dot (200 AM) reached 95% less than the initial dot size measured on the printed sheet. The solid wear was evaluated by observing the optical density loss on the solid areas and wear on the lithographic printing plate.

Results and Discussion:

The results of the printing tests together with the press performances are shown below in TABLES II and III. The results show that inclusion of the crosslinked poly(methyl methacrylate) particles in infrared radiation-sensitive imageable layer in Invention Examples 1 and 2 provided printing plate speeds below 42 mJ/cm$^2$. The DOP results for the exposed lithographic printing plate precursors were below 20 sheets and after humid aging and dry aging of precursors, the DOP value was well below 50 sheets.

The results in Invention Examples 1 and 2 and Comparative Examples 1 and 2 also showed that by using secondary crosslinked hydrophobic binders, good ink receptivity can be obtained. Comparative Example 3 showed that by omitting this material, ink receptivity was poor and required more than 100 sheets before the lithographic printing plate achieved good ink density. However, the non-crosslinked hydrophobic binder showed shadow plugging especially after aging, whereas the use of the crosslinked hydrophobic binder particles cleared out in the screen areas within a few printed impressions. The secondary crosslinked hydrophobic binder provided a run length equivalent to that when the non-crosslinked secondary binder was used.

Evaluation of Resolution:

The number of squares giving a completely clean 20 point score in the 5 days 40° C./80% RH and 3 days 50° C. dry heat aged precursors are shown below in TABLE III.

TABLE IV below also shows the pixel dial evaluation of the aged lithographic printing plate precursors together with the fresh lithographic printing plate precursors.

TABLE II

| | Invention Example 1 | Comparative Example 1 | Invention Example 2 | Comparative Example 2 | Comparative Example 3 | Invention Example 3 | Invention Example 4 | Invention Example 5 |
|---|---|---|---|---|---|---|---|---|
| Speedpoint | 35 | 33 | 37 | 35 | 42 | 37 | 35 | 32 |
| Fresh DOP | 12 | 14 | 7 | 8 | 5 | 6 | 8 | 8 |
| DOP 5 Days 40° C./80% rH | 23 | 26 | 19 | 18 | 20 | 18 | 20 | 15 |
| DOP 5 Days 50° C. dry Heat | 18 | 28 | 14 | 13 | 12 | 12 | 14 | 12 |
| Full ink receptivity (sheets) | 3 | 3 | 3 | 3 | 30 | 3 | 3 | 3 |
| LOR | 120,000 | 120,000 | 100,000 | 100,000 | 90,000 | 110,000 | 100,000 | 90,000 |

TABLE III

| | Sheets | Invention Example 1 | Comparative Example 1 | Invention Example 2 | Comparative Example 2 | Comparative Example 3 | Invention Example 3 | Invention Example 4 | Invention Example 5 |
|---|---|---|---|---|---|---|---|---|---|
| Non-aged plates | 20th | 10 | 12 | 8 | 8 | 8 | 9 | 8 | 8 |
| Non-aged plates | 50th | 0 | 0 | 0 | 0 | 0 | 0 | 0 | 0 |
| Non-aged plates | 100th | 0 | 0 | 0 | 0 | 0 | 0 | 0 | 0 |
| 5 Days 40° C./80% rH | 20th | not clean | not clean | 14 | 20 | n.a.* | 12 | 13 | 12 |
| 5 Days 40° C./80% rH | 50th | 3 | 20 | 0 | 9 | n.a.* | 0 | 0 | 0 |
| 5 Days 40° C./80% rH | 100th | 0 | 1 | 0 | 0 | n.a.* | 0 | 0 | 0 |
| 3 days 50° C. dry heat | 20th | 18 | not clean | 1 | 20 | n.a.* | 1 | 1 | 1 |
| 3 days 50° C. dry heat | 50th | 5 | 20 | 0 | 19 | n.a.* | 0 | 0 | 0 |
| 3 days 50° C. dry heat | 100th | 0 | 20 | 0 | 18 | n.a.* | 0 | 0 | 0 | n.a.*: No plugging seen but lithographic printing plate showed poor ink receptivity

TABLE IV

| | Sheets | Invention Example 1 | Comparative Example 1 | Invention Example 2 | Comparative Example 2 | Comparative Example 3 | Invention Example 3 | Invention Example 4 | Invention Example 5 |
|---|---|---|---|---|---|---|---|---|---|
| Non-aged plates | 20th | 6 × 6 | 8 × 8 | 5 × 5 | 8 × 8 | 5 × 5 | 6 × 6 | 6 × 6 | 6 × 6 |
| Non-aged plates | 50th | 5 × 5 | 5 × 5 | 5 × 5 | 5 × 5 | 5 × 5 | 5 × 5 | 5 × 5 | 5 × 5 |
| Non-aged plates | 100th | 5 × 5 | 5 × 5 | 5 × 5 | 5 × 5 | 5 × 5 | 5 × 5 | 5 × 5 | 5 × 5 |
| 5 Days 40° C./80% rH | 20th | not clean | not clean | 9 × 9 | 10 × 10 | n.a.* | not clean | not clean | not clean |
| 5 Days 40° C./80% rH | 50th | 8 × 8 | 11 × 11 | 7 × 7 | 10 × 10 | n.a.* | 8 × 8 | 8 × 8 | 8 × 8 |
| 5 Days 40° C./80% rH | 100th | 5 × 5 | 5 × 5 | 5 × 5 | 5 × 5 | n.a.* | 4 × 4 | 5 × 5 | 5 × 5 |
| 3 days 50° C. dry heat | 20th | 10 × 10 | not clean | 7 × 7 | 12 × 12 | n.a.* | 10 × 10 | 10 × 10 | 10 × 10 |
| 3 days 50° C. dry heat | 50th | 8 × 8 | 12 × 12 | 6 × 6 | 12 × 12 | n.a.* | 6 × 6 | 8 × 8 | 6 × 6 |
| 3 days 50° C. dry heat | 100th | 6 × 6 | 9 × 9 | 5 × 5 | 9 × 9 | n.a.* | 6 × 6 | 6 × 6 | 6 × 6 |

To check the hydrophobic property of the crosslinked particles, samples of each polymer was dried at 50° C. for 3 days, weighed, and then exposed to 40° C. at 80% rH (relative humidity) for 24 hours. The % weight increase, which is an indication of the hydrophilicity, was then measured. Crosslinked polymers by definition are insoluble in any solvent. To check this property, various polymer samples were tested for their solubility in a known strong solvent, dimethyl sulfoxide (DMSO). PVP K15 is extremely hydrophilic and therefore its solubility in water was tested. The results are shown below in TABLE V.

TABLE V

| Polymer | % Weight Increase | Soluble in |
|---|---|---|
| Copolymer A | 2.5 | DMSO |
| HYBRIDUR ® 580 | 3.2 | DMSO |
| HYBRIDUR ® 878 | 2.3 | DMSO |
| Poly(methyl methacrylate) | 0.8 | DMSO |
| PVP K 15 | 27.1 | Water |
| CP1 | 0.8 | Insoluble |

TABLE V-continued

| Polymer | % Weight Increase | Soluble in |
|---|---|---|
| CP2 | 0.7 | Insoluble |
| CP3 | 0.8 | Insoluble |

The results in TABLE V show that poly(methyl methacrylate) and the crosslinked particles CP1-3 have the highest hydrophobicity.

The results in TABLE III and IV show that the lithographic printing plates produced according to the present invention showed good resolution requiring less number of sheets (printed impressions) to clear the shadows during development on-press. In the Comparative lithographic printing plates containing no secondary crosslinked hydrophobic binder, the shadows remained plugged especially after the precursor had been aged, requiring many more sheets (printed impressions) to clear during development (processing) on-press. Omitting the secondary crosslinked hydrophobic binder also caused poor ink receptivity after the precursor had been aged, and the lithographic ink was even repelled by the exposed imageable layer, thus making evaluation difficult.

The results described above therefore show the clear benefit of obtaining good resolution while maintaining the other good properties by replacing a non-crosslinked hydrophobic binder with a crosslinked hydrophobic binder as a secondary binder, and particularly when such secondary binder is present in the form of particles.

The invention has been described in detail with particular reference to certain preferred embodiments thereof, but it will be understood that variations and modifications can be effected within the spirit and scope of the invention.

The invention claimed is:

1. A negative-working, infrared radiation-sensitive lithographic printing plate precursor, comprising:
    a substrate having a hydrophilic surface, and
    an infrared radiation-sensitive imageable layer that is disposed on the hydrophilic surface of the substrate and that is the outermost layer in the negative-working, infrared radiation-sensitive lithographic printing plate precursor, and the infrared radiation-sensitive imageable layer comprises:
        a free radically polymerizable compound;
        an initiator composition that provides free radicals upon exposure of the infrared radiation-sensitive imageable layer to infrared radiation;
        an infrared radiation absorber;
        a primary polymeric binder comprising polyalkylenes oxide segments and optionally pendant cyano groups and is present in the form of particles; and
        a secondary crosslinked hydrophobic binder that is present in an amount of at least 1 weight % and up to and including 20 weight % based on the total dry weight of the infrared radiation-sensitive imageable layer,
    wherein the secondary crosslinked hydrophobic binder comprises recurring units derived from one or more multifunctional monomers comprising two or more ethylenically unsaturated polymerizable groups per molecule, and recurring units derived from one or more monofunctional hydrophobic monomers having one ethylenically unsaturated polymerizable group per molecule.

2. The negative-working, infrared radiation-sensitive lithographic printing plate precursor of claim 1, wherein the primary polymeric binder comprises recurring units comprising polyalkylenes oxide segments and recurring units comprising pendant cyano groups.

3. The negative-working, infrared radiation-sensitive lithographic printing plate precursor of claim 1, wherein the primary polymeric binder is present in the infrared radiation-sensitive imageable layer in an amount of at least 10 weight % and up to and including 70 weight %, based on the total dry weight of the infrared radiation-sensitive imageable layer.

4. The negative-working, infrared radiation-sensitive lithographic printing plate precursor of claim 1, wherein the primary polymeric binder is present in the form of particles having an average particle size that is less than an average dry thickness of the infrared radiation-sensitive imageable layer.

5. The negative-working, infrared radiation-sensitive lithographic printing plate precursor of claim 1, wherein the primary polymeric binder is at least 0.05% and up to and including 80% of an average dry thickness of the infrared radiation-sensitive imageable layer.

6. The negative-working, infrared radiation-sensitive lithographic printing plate precursor of claim 1, wherein the secondary crosslinked hydrophobic binder is present in an amount of at least 1 weight % and up to and including 15 weight %, based on the total dry weight of the infrared radiation-sensitive imageable layer.

7. The negative-working, infrared radiation-sensitive lithographic printing plate precursor of claim 1, wherein the secondary crosslinked hydrophobic binder has a moisture absorption rate of less than 2%.

8. The negative-working, infrared radiation-sensitive lithographic printing plate precursor of claim 1, wherein the secondary crosslinked hydrophobic binder has a moisture absorption rate of less than 1%.

9. The negative-working, infrared radiation-sensitive lithographic printing plate precursor of claim 1, wherein the infrared radiation-sensitive imageable layer is present at a dry coverage of at least $0.4 \text{ g/m}^2$ and up to and including $1.8 \text{ g/m}^2$.

10. The negative-working, infrared radiation-sensitive lithographic printing plate precursor of claim 1, wherein the secondary crosslinked hydrophobic binder is provided as particles having an average particle size of at least 0.2 µm and up to and including 1 µm.

11. The negative-working, infrared radiation-sensitive lithographic printing plate precursor of claim 1, wherein the secondary crosslinked hydrophobic binder comprises at least 90 weight % of recurring units derived from monofunctional hydrophobic monomers selected from the group consisting of alkyl (meth)acrylate, cycloalkyl (meth)acrylate, aralkyl (meth)acrylate, aryl (meth)acrylate, (meth)acrylonitrile, styrene, alpha-methyl styrene, vinyl chloride, olefins, and (meth)acrylamide having on the amide nitrogen at least one substituent selected from the group consisting of, alkyl, cycloalkyl, aralkyl, and aryl.

12. A method for providing a lithographic printing plate, the method comprising:
    imagewise exposing the negative-working, infrared radiation-sensitive lithographic printing plate precursor of claim 1 to infrared radiation to provide exposed regions and non-exposed regions in the infrared radiation-sensitive imageable layer, and
    removing the non-exposed regions in the infrared radiation-sensitive imageable layer from the substrate to provide a lithographic printing plate.

13. The method of claim 12, comprising removing the non-exposed regions on-press using a fountain solution, lithographic printing ink, or both fountain solution and lithographic printing ink.

14. The method of claim 12, comprising removing the non-exposed regions off-press using an aqueous alkaline solution having a pH equal to or less than 10.

15. The method of claim 14, wherein the aqueous alkaline solution is free of silicates and metasilicates.

16. The method of claim 14, wherein the aqueous alkaline solution also provides a protective coating over the lithographic printing plate, and the lithographic printing plate is not further treated or rinsed before being used for lithographic printing.

* * * * *